(12) United States Patent
Mori et al.

(10) Patent No.: US 11,128,299 B2
(45) Date of Patent: Sep. 21, 2021

(54) MONITORING SYSTEM

(71) Applicant: Murata Manufacturing Co., Ltd., Nagaokakyo (JP)

(72) Inventors: Kenichi Mori, Nagaokakyo (JP); Takashi Kihara, Nagaokakyo (JP); Yoshihiro Yamaguchi, Nagaokakyo (JP); Fumiya Isono, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 483 days.

(21) Appl. No.: 16/150,786

(22) Filed: Oct. 3, 2018

(65) Prior Publication Data

US 2019/0036528 A1    Jan. 31, 2019

Related U.S. Application Data

(63) Continuation of application No. PCT/JP2017/015819, filed on Apr. 20, 2017.

(30) Foreign Application Priority Data

Apr. 22, 2016  (JP) .............................. JP2016-085670
Sep. 23, 2016  (JP) .............................. JP2016-185642

(51) Int. Cl.
*H03K 17/96* (2006.01)
*H04Q 9/00* (2006.01)
(Continued)

(52) U.S. Cl.
CPC ............ *H03K 17/964* (2013.01); *G08B 3/10* (2013.01); *G08B 5/22* (2013.01); *H04Q 9/00* (2013.01);
(Continued)

(58) Field of Classification Search
CPC ......... H03K 17/964; H03K 2217/9651; H03K 2217/96003; H04Q 9/00; G08B 13/14;
(Continued)

(56) References Cited

U.S. PATENT DOCUMENTS 6,283,377 B1    9/2001  Takuma
9,045,311 B2    6/2015  Chen
(Continued)

FOREIGN PATENT DOCUMENTS

CN    103183259 A    7/2013
CN    105319976 A    2/2016
(Continued)

OTHER PUBLICATIONS

International Search Report issued for PCT/JP2017/015819, dated May 23, 2017.
(Continued)

*Primary Examiner* — Brian Wilson
(74) *Attorney, Agent, or Firm* — Arent Fox LLP

(57) ABSTRACT

A monitoring system for determining whether an object is touched by a living body includes a receiver and a piezoelectric sensor attached to a substrate such that when the substrate is attached to the object. The piezoelectric sensor generates an output signal as a function of whether the living body is in contact with at least one of the substrate and the object. A processor processes the output signal to determine whether the living body is in contact with at least one of the substrate and the object and outputs a contact information signal containing information indicative of whether the living body is in contact with at least one of the substrate and object based on the determination. A transmitter transmits the contact information signal to the receiver.

17 Claims, 18 Drawing Sheets

(51) Int. Cl.
*G08B 3/10* (2006.01)
*G08B 5/22* (2006.01)
*G06Q 30/06* (2012.01)
*A47F 10/02* (2006.01)

(52) U.S. Cl.
CPC ........ *A47F 2010/025* (2013.01); *G06Q 30/06* (2013.01); *H03K 2217/96003* (2013.01); *H03K 2217/9651* (2013.01)

(58) Field of Classification Search
CPC .. G08B 3/10; G08B 5/22; G06Q 30/06; A47F 2010/025
See application file for complete search history.

(56) References Cited

U.S. PATENT DOCUMENTS

| | | | | |
|---|---|---|---|---|
| 9,626,535 | B2* | 4/2017 | Baker | G06K 7/10009 |
| 2007/0247306 | A1* | 10/2007 | Case, Jr. | G08B 1/08 340/539.11 |
| 2013/0163219 | A1 | 6/2013 | Chen | |
| 2016/0180363 | A1* | 6/2016 | Burkhart | G06Q 30/0207 705/14.1 |
| 2017/0127749 | A1* | 5/2017 | Boeck | A61B 5/01 |
| 2017/0357886 | A1* | 12/2017 | Kawamura | G06K 19/0716 |

FOREIGN PATENT DOCUMENTS

| | | |
|---|---|---|
| JP | 3145948 B2 | 3/2001 |
| JP | 2005328985 | 12/2005 |

OTHER PUBLICATIONS

Written Opinion of the International Searching Authority issued for PCT/JP2017/015819, dated May 23, 2017.

\* cited by examiner

MONITORING SYSTEM

CROSS REFERENCE TO RELATED APPLICATIONS

The present application is a continuation of International application No. PCT/JP2017/015819, filed Apr. 20, 2017, which claims priority to Japanese Patent Application No. 2016-185642, filed Sep. 23, 2016, which claims priority to Japanese Patent Application No. 2016-085670, filed Apr. 22, 2016, the entire contents of each of which are incorporated herein by reference.

TECHNICAL FIELD

An embodiment of the present invention relates to a monitoring system including a piezoelectric contact sensor unit and a communication device.

BACKGROUND ART

There has conventionally been proposed a monitoring system that investigates which piece of goods is picked up by a customer among a plurality of pieces of goods displayed on a display shelf in a selling area of a shop.

For example, Japanese Patent Application Laid-Open No. 2005-328985 ("Patent Document 1") discloses a monitoring system that reads information relating to movement of goods by using a non-contact IC tag attached to each of a plurality of pieces of goods displayed on a display shelf and an IC tag reader provided on the display shelf.

The monitoring system of Patent Document 1 reads information relating to movement of goods based on a frequency and a time period in which the goods are picked up by a customer. The monitoring system of Patent Document 1 performs a variety of types of calculation based on the information.

The monitoring system of Patent Document 1 cannot correctly determine whether goods are picked up by a customer or have merely been moved out of a detection range of the IC tag reader, depending on an installation position of the IC tag reader.

An object of an embodiment of the present invention is to provide a monitoring system that can reliably detect picking up of goods by a living body.

BRIEF SUMMARY OF THE INVENTION

In accordance with one aspect of the invention, a monitoring system for determining whether an object is touched by a living body includes:
 a receiver;
 a piezoelectric sensor attached to a substrate such that when the substrate is attached to the object, the piezoelectric sensor generates an output signal as a function of whether the living body is in contact with at least one of the substrate and the object;
 a processor that processes the output signal to determine whether the living body is in contact with at least one of the substrate and the object and outputs a contact information signal containing information indicative of whether the living body is in contact with at least one of the substrate and object based on the determination;
 a transmitter that transmits the contact information signal to the receiver.

In the preferred embodiment the piezoelectric sensor detects biological tremors of the living body when the living body is in contact with at least one of the substrate and the object and the output signal provides an indication of such detected biological tremors. In such a case, the processor determines whether the living body is in contact with at least one of the substrate and the object as a function of whether or not the output signal indicates that the biological tremors are detected.

In preferred embodiments, the piezoelectric sensor also detects bending forces applied to the substrate and the output signal provides an indication of such detected bending forces. In such a case, the processor determines whether the living body is in contact with at least one of the substrate and the object as a function of whether or not the output signal indicates that the biological tremors are detected and whether or not the output signal indicates that a predetermined level of bending forces have been applied to the substrate.

In an aspect of the invention, the information indicative of whether the living body is in contact with at least one of the substrate and object includes a determination that the object has been picked up.

In another aspect of the invention, information indicative of whether the living body is in contact with at least one of the substrate and object is determined as a function of the amount of time that the living body is in contact with the object.

In some embodiments, the object is a product. In another embodiment, the object is a display case.

In preferred embodiments, the receiver includes a display which displays information indicating that the living body has been in contact with at least one of the substrate and the object. The display can display information concerning the object. The information can be sales information.

In preferred embodiments, the monitoring system includes a memory that stores the contact information and the receiver includes a memory that stores the contact information provided in the contact information signal.

The receiver can include a notification unit that provides an indication that the living body is in contact with the object. The indication can be visual and/or audible.

MODE FOR CARRYING OUT THE INVENTION

Hereinafter, a monitoring system according to a first embodiment of the present invention will be described.

Figure 1:
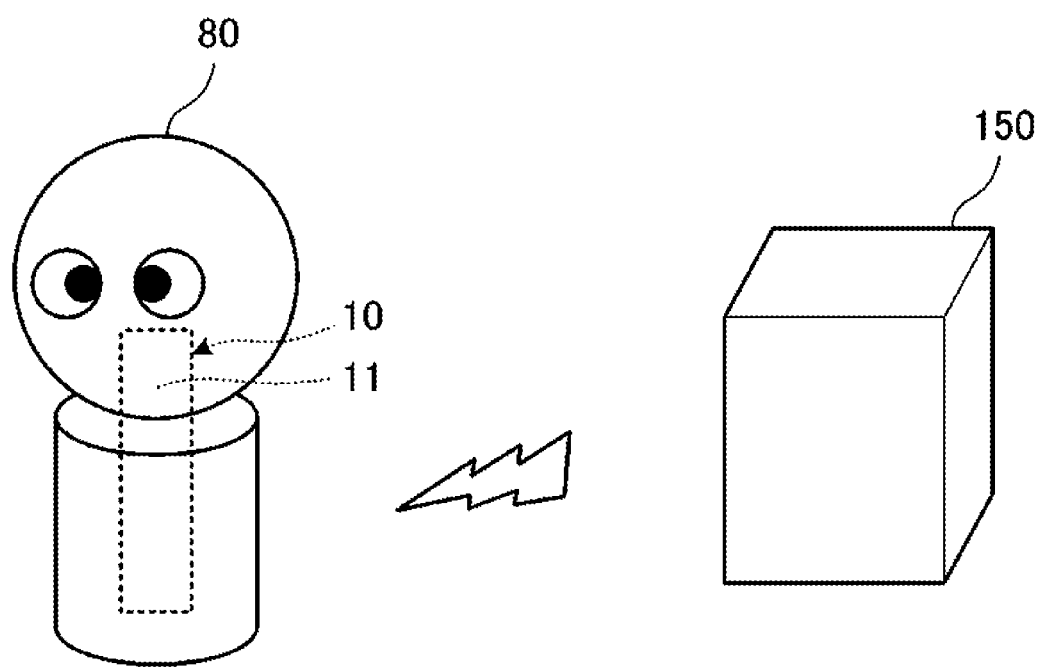
FIG. 1 is an external view of a monitoring system 100 according to a first embodiment of the present invention.
Figure 2:
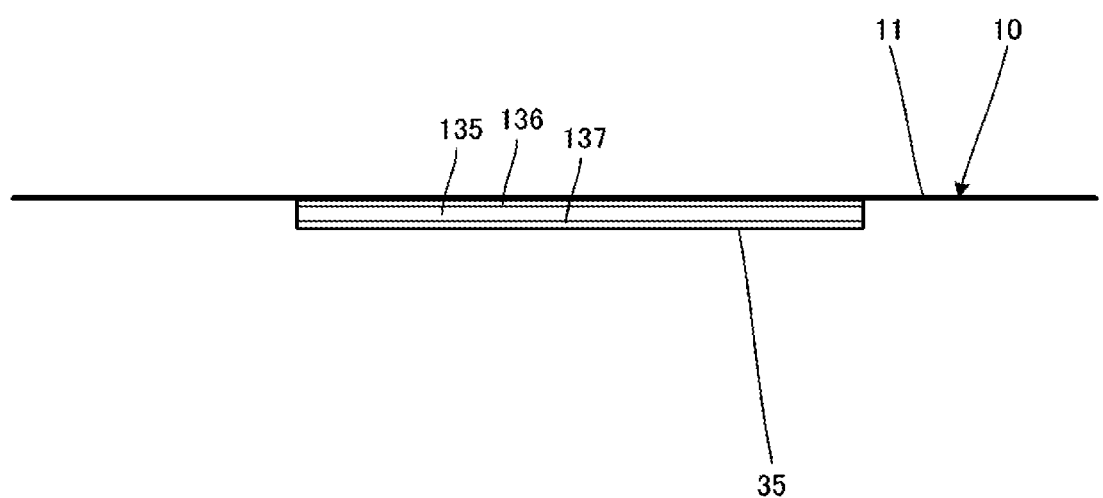
FIG. 2 is a side view of a piezoelectric contact sensor unit 10 shown in FIG. 1.
Figure 3:
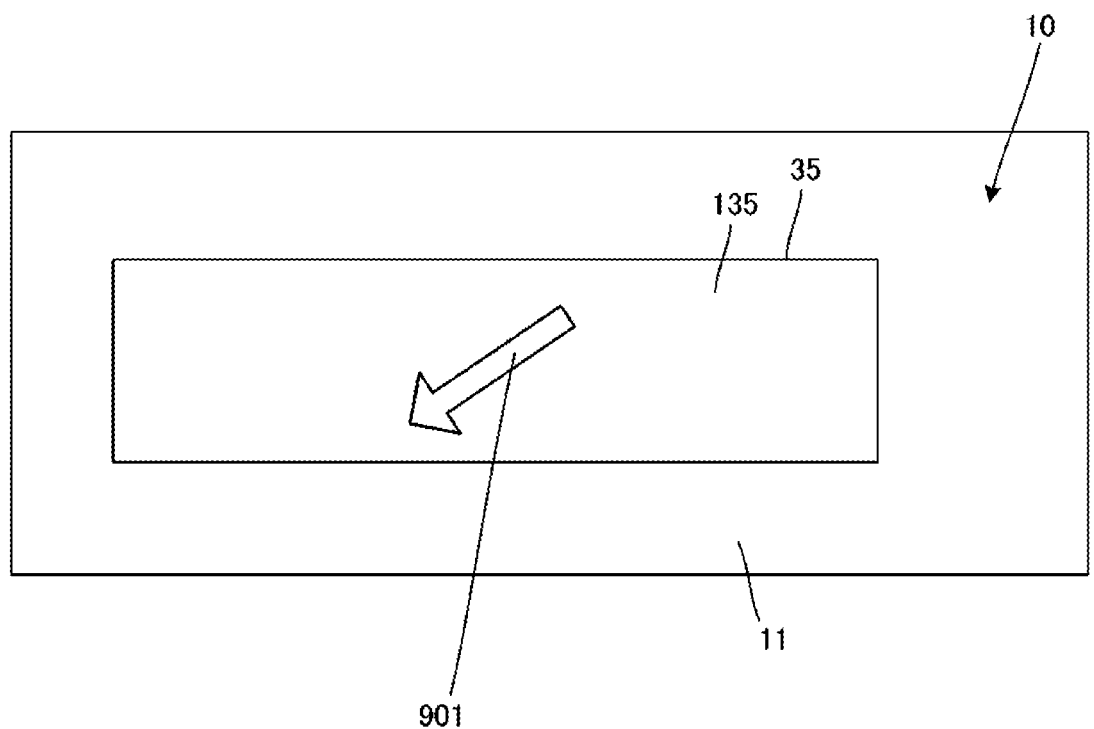
FIG. 3 is a front view of the piezoelectric contact sensor unit 10 shown in FIG. 1.
Figure 4:
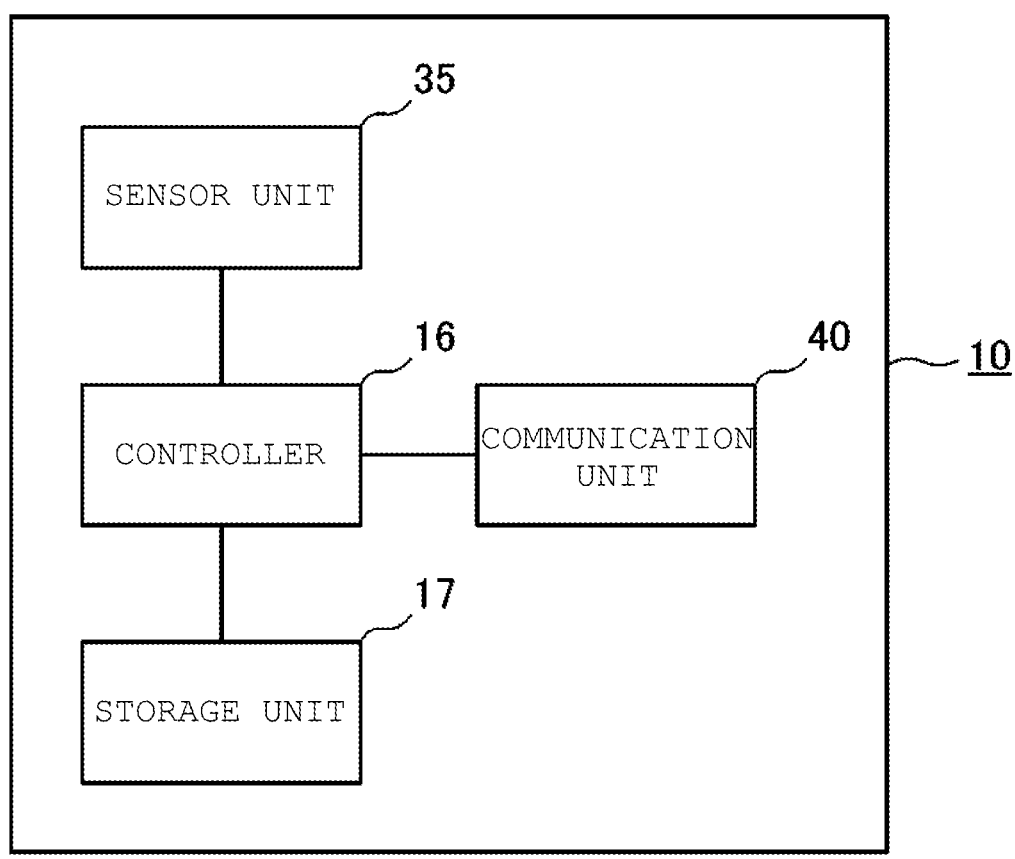
FIG. 4 is a block diagram of the piezoelectric contact sensor unit 10 shown in FIG. 1.
Figure 5:
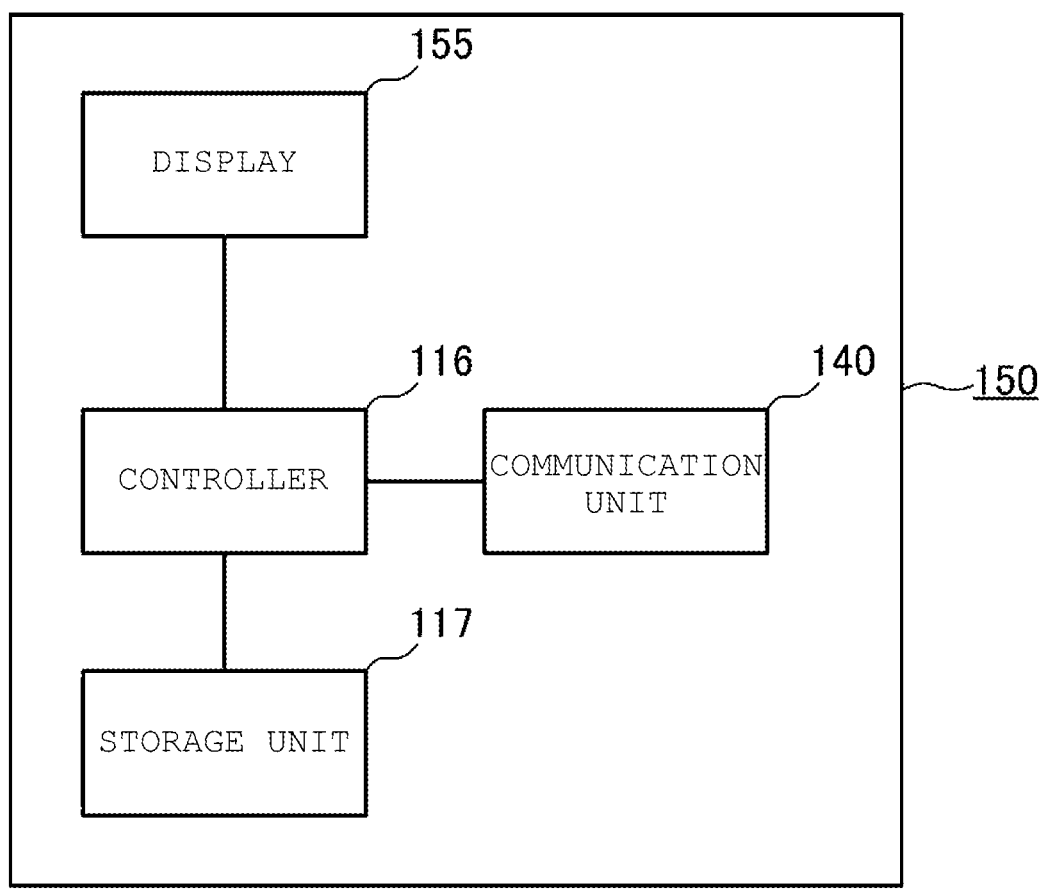
FIG. 5 is a block diagram of a host device 150 shown in FIG. 1.

FIG. 1 is an external view of a monitoring system 100 according to the first embodiment of the present invention FIG. 2 is a side view of a piezoelectric contact sensor unit 10 shown in FIG. 1. FIG. 3 is a front view of the piezoelectric contact sensor unit 10 shown in FIG. 1. FIG. 4 is a block diagram of the piezoelectric contact sensor unit 10 shown in FIG. 1. FIG. 5 is a block diagram of a host device 150 shown in FIG. 1.

As shown in FIG. 1, a monitoring system 100 includes the piezoelectric contact sensor unit 10 and a host device 150. The monitoring system 100 determines whether a given product has been picked up by a customer and generates an output signal as a function thereof. Typically the product is one among a plurality of products displayed on a display shelf in a selling area of a shop. A respective piezoelectric contact sensor unit 10 is attached to at least one, and preferably all, of a plurality of products displayed on a display shelf. Thus, in the preferred embodiment, the monitoring system 100 includes a plurality of the piezoelectric contact sensor units 10 and the host device 150.

Each piezoelectric contact sensor unit 10 includes a substrate 11 and a piezoelectric sensor 35. The substrate 11 is preferably attached to the inside or a back surface of the product 80 so that a customer is not aware of the piezoelectric contact sensor unit 10. The substrate 11 is attached to a section of the product 80 that is easily deformed when a customer picks up the product 80.

The piezoelectric contact sensor unit 10 preferably has portable size and weight. For this reason, a salesperson can carry the piezoelectric contact sensor unit 10 and easily attach it to the product 80. A customer can pick up and touch the product 80 to which the piezoelectric contact sensor unit 10 is attached and also can pick up and observe the product 80 from various angles.

In system terms, each of the piezoelectric contact sensor units 10 is a slave unit to the host device 150. As shown in FIGS. 2 to 4, the piezoelectric contact sensor unit 10 includes the substrate 11, a controller 16, a memory 17, a communication unit 40, and a piezoelectric sensor 35.

The host device 150 is what is called a master unit, and, as shown in FIG. 5, includes a communication unit 140, a storage unit 117, a controller 116 and a display 155. The host device 150 is preferably installed, for example, in an administrative room of a shop. In the preferred embodiment, the controller is a CPU. However, other types of controllers can be used. When the controller is a CPU, the program for controlling the CPU is typically stored in the storage unit or memory 117. The storage unit 117 is configured, for example, with a hard disk. The display 155 is configured, for example, with a liquid crystal monitor. By using the monitoring system 100, a salesperson can check how much a customer is interested in each product more accurately. With a real-time situation transmitted to a mobile terminal held by a salesperson, the salesperson can serve a customer in consideration of degree of his or her interest in the product.

In the present embodiment, the piezoelectric sensor unit is used to determine whether a product 80 has been touched and/or picked up. However, the invention is not so limited. More generally the invention can be used to determine whether a living body (e.g., a person) has contacted and/or picked up an object. Examples of other objects are set forth in some of the embodiments disclosed herein.

As shown in FIGS. 1 to 3, the substrate 11 is preferably an insulating flexible plate, and is formed of polymer having comparatively high strength, such as polyethylene terephthalate (PET), polyethylene naphthalate (PEN), polycarbonate (PC), and acrylic resin (PMMA).

The substrate 11 preferably has a plate-like shape. A thickness of the substrate 11 is appropriately set in accordance with strength required for the substrate 11. The controller 16, the storage unit 17, the communication unit 40, and the piezoelectric sensor 35 are preferably mounted on a surface of the substrate 11.

The controller 16 is configured, for example, with a microcomputer and includes a timer circuit (not shown). The storage unit 17 is configured, for example, with a flash memory. The storage unit 17 preferably stores a control program that is used by the microcomputer and controls the operation of each unit of the piezoelectric contact sensor unit 10.

As shown in FIG. 3, the piezoelectric sensor 35 includes a rectangular piezoelectric film 135. As best shown in FIG. 2, a signal electrode 136 and a GND electrode 137 are formed on opposite main surfaces of the piezoelectric film 135. The signal electrode 136 is configured, for example, with a copper foil and an aluminum foil. The GND electrode 137 is configured, for example, with a conductive nonwoven film. The GND electrode 137 is formed, for example, on a main surface of the piezoelectric film 135 by silver printing.

Since the substrate 11 can be significantly deformed, an organic electrode using ITO, ZnO, and polythiophene as main components, an organic electrode using polyaniline as a main component, a silver nanowire electrode, a carbon nanotube electrode, and the like are preferably used for the GND electrode 137 and the signal electrode 136. By using the above materials, an electrode pattern excellent in flexibility can be formed.

The piezoelectric film 135 is preferably a piezoelectric film, and is preferably formed of uniaxially stretched polylactic acid (PLA) or L-type polylactic acid (PLLA).

The piezoelectric film 135 is formed of uniaxially stretched L-type polylactic acid (PLLA). In the present embodiment, the piezoelectric film 135 is uniaxially stretched in a direction that is substantially along a diagonal line of a rectangle (refer to an arrow shown in FIG. 3).

Hereinafter, the direction will be referred to as a uniaxially stretching direction 901. The uniaxially stretching direction 901 preferably forms an angle of 45° with respect to a longitudinal direction or a lateral direction of the piezoelectric film 135. However, the angle is not limited to the above, and may be designed to an optimum angle in consideration of a characteristic and a use state of the piezoelectric film 135. For example, the uniaxially stretching direction preferably forms an angle of 45° with respect to a bending direction.

The angle is not limited strictly to 45°, and may be substantially 45°. The angle of substantially 45° includes, for example, an angle of around 45°±10°. The above angles are setting matters to be designed as appropriate in accordance with entire design, such as bending detection accuracy, based on a use of the piezoelectric contact sensor unit 10.

The PLLA described above is a chiral polymer with a main chain having a spiral structure. The PLLA is uniaxially stretched and has piezoelectricity when molecules are oriented. The uniaxially stretched PLLA generates charges when a flat film surface of the piezoelectric film is pressed. An amount of charges generated at this time is uniquely determined based on an amount of displacement of the pressed flat film surface that is displaced in a direction orthogonal to the plat film surface. A piezoelectric constant of the uniaxially stretched PLLA belongs to a group having an extremely high piezoelectric constant among polymers.

Accordingly, a displacement of the piezoelectric film 135 caused by bending of the substrate 11 can be reliably detected at high sensitivity by using the PLLA. That is, bending of the substrate 11 can be reliably detected, and an amount of the bending can be detected with a high degree of sensitivity.

A stretching magnification is preferably around three to eight times. By applying heat treatment after stretching, crystallization of an extended-chain crystal of polylactic acid is promoted, and a piezoelectric constant is increased. When biaxial stretching is applied, stretching magnifications of axes are made different, so that an effect similar to that of uniaxial stretching can be obtained. For example, when stretching of eight times is applied in a direction as an x-axis and stretching of two times is applied in a y-axis direction orthogonal to the x-axis, an effect similar to that of uniaxial stretching of around four times applied to the x-axis direction can be obtained with respect to a piezoelectric constant. A film simply applied with uniaxial stretching is easily split along a stretching axis direction. Accordingly, by applying biaxial stretching, strength can be somewhat improved.

The PLLA generates piezoelectricity by molecule orientation processing by stretching and the like, and does not require polling processing to be performed like other polymers, such as PVDF, and piezoelectric ceramics. That is, piezoelectricity of the PLLA that does not belong to a ferroelectric substance does not express by polarization of ions like ferroelectric substances, such as PVDF and PZT, and derives from a spiral structure which is a characteristic structure of a molecule.

For this reason, pyroelectricity that is generated in other ferroelectric and piezoelectric substances is not generated in the PLLA. Further, in PVDF and the like, a temporal change is observed in a piezoelectric constant, and, in some cases, a piezoelectric constant is significantly lowered. However, a piezoelectric constant of the PLLA is extremely stable over time. Accordingly, deformation of the piezoelectric film 135 can be detected at high sensitivity without any influence from an ambient environment.

The PLLA has a high piezoelectric output constant (=piezoelectric g constant, $g=d/\varepsilon T$). Accordingly, by using the PLLA, deformation of the piezoelectric film 135 can be detected at extremely high sensitivity.

The controller 16 may be mounted on any main surface of the substrate 11, and is preferably disposed on the same surface as the piezoelectric sensor 35. By disposing the piezoelectric sensor 35 and the controller 16 on the same surface, the piezoelectric sensor 35 and the controller 16 can be connected without using an interlayer connection conductor, such as a via hole having a large conductor loss. As a result, a weak signal from the piezoelectric sensor 35 can be detected with high accuracy.

Next, a method for using the piezoelectric sensor 35 to detect bending deformation of the substrate 11 will be described.

Figure 6A:
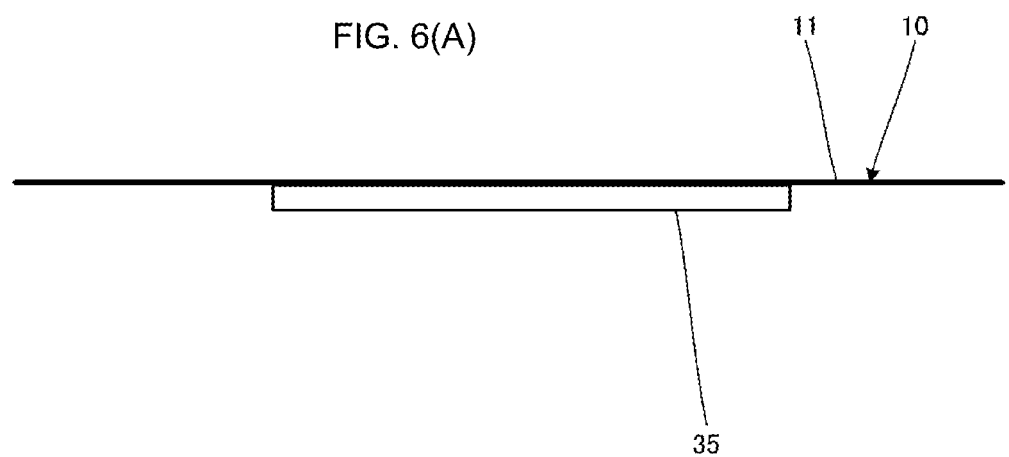
FIG. 6A is a side view of the piezoelectric contact sensor unit 10 shown in FIG. 1.
Figure 6B:
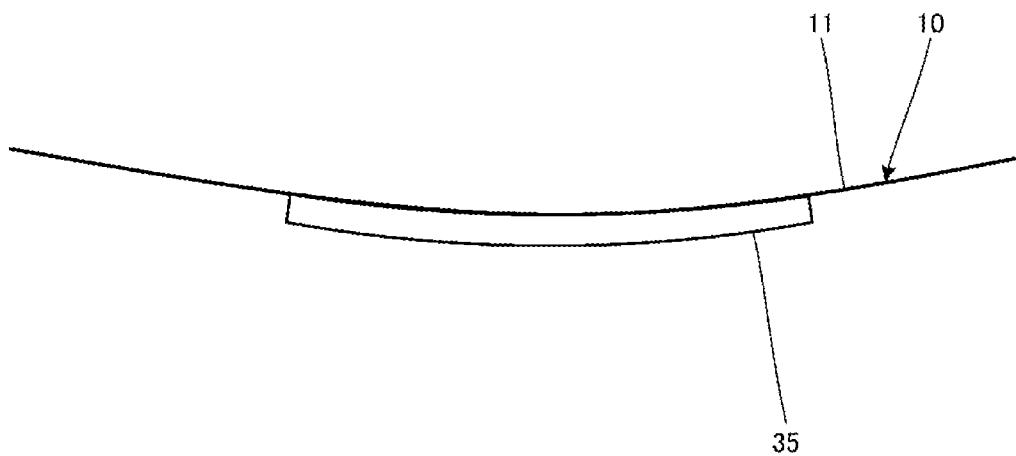
FIG. 6B is a side view showing a state in which a customer bends the piezoelectric contact sensor unit 10 shown in FIG. 1.

FIG. 6A is a side view of the piezoelectric contact sensor unit 10 shown in FIG. 1. FIG. 6B is a side view showing a state in which a customer bends the piezoelectric contact sensor unit 10 shown in FIG. 1. The bending amount of the piezoelectric contact sensor unit 10 is exaggerated in FIG. 6B.

As shown in FIG. 6A, when bending deformation is zero (i.e., the piezoelectric contact sensor unit 10 is not bent), the substrate 11 is in a flat state. In this case, the piezoelectric film 135 of the piezoelectric sensor 35 is neither stretched nor shrunk, and an output voltage from the piezoelectric sensor 35 does not indicate that the piezoelectric film has been deformed.

On the other hand, when a customer presses the center of the substrate 11 and bends the substrate 11 as shown in FIG. 6B, the substrate 11 is curved along a longitudinal direction. In this case, the piezoelectric film 135 of the piezoelectric sensor 35 is stretched or shrunk depending on a surface on which the piezoelectric sensor 35 is adhered to the substrate 11 and a bending direction with the result that the piezoelectric film generates an output (a charge).

The piezoelectric sensor 35 detects the charge generated on the signal and GND electrodes 136 and 137 of the piezoelectric film 135 and detects bending deformation of the substrate 11 as a function of this charge. When the charge meets certain criteria, the piezoelectric sensor 35 outputs a signal having a voltage value VM and indicating that the substrate 11 has been bent to the controller 16.

The voltage value VM changes in accordance with the degree of deformation of the piezoelectric film 135. As a result, the controller 16 can detect a deformation state of the piezoelectric film 135 from the voltage value VM. The voltage value VM is changed, for example, as described below.

When bending deformation is +a (i.e., the substrate 11 is bent in a positive direction by an amount a), the voltage value VM is +Va due to a relationship between the uniaxially stretching direction 901 and a bending direction (a longitudinal direction of the substrate 11). When bending deformation is +b (i.e., the substrate 11 is bent in a positive direction by an amount b), +b being less than +a, the voltage value VM is +Vb which is less than +Va.

In this case, +Va and +Vb are, for example, in a relationship of 0<+Vth2<+Vth3<+Vb<+Vth1<+Va wherein +Vth1 is a first threshold value, +Vth2 is a second threshold value, and +Vth3 is a third threshold value. The first threshold value, the second threshold value, and the third threshold value will be described in detail below.

On the other hand, when bending deformation is −a (i.e., the substrate 11 is bent in a negative direction—that is, a direction opposite to the positive direction—by an amount a), the voltage value VM is −Va. When bending deformation is −b, the voltage value VM is −Vb which is greater than −Va (that is, it is more negative and of greater absolute value than −Va).

In this case, −Va and −Vb are, for example, in a relationship of 0>−Vth2>−Vth3>−Vb>−Vth1>−Va wherein −Vth1 is the first threshold value, −Vth2 is the second threshold value, and −Vth3 is the third threshold value. The first threshold value, the second threshold value, and the third threshold value will be described in detail below.

Accordingly, the controller 16 can detect both a bending direction and a bending amount by measuring the voltage value VM.

Next, a description of a method of detecting a minute vibration (what is called a biological tremor) of a living body that is generated when the living body is in contact with the substrate 11 or the product 80 will be described.

The controller 16 records the voltage value VM output from the piezoelectric sensor 35 as a signal on a time axis and converts the signal on the time axis to a signal on a frequency axis. The controller 16 determines whether or not a contact state, in which a living body is in contact with the substrate 11 or the product 80, is established based on the signal on the frequency axis.

When a finger of a customer is in contact with the substrate 11 or the product 80, a voltage showing a voltage change (minute vibration) of a certain frequency is output from the piezoelectric sensor 35 to the controller 16.

A mechanical minute vibration (what is called a biological tremor) of a muscle exists as a physiological phenomenon of a living body. A biological tremor is a vibration of a certain frequency within a predetermined frequency band (for example, a band of around 5 to 20 Hz). A biological tremor is transmitted to the piezoelectric film 135 only when a finger (or other portion of the customer's hand) is in contact with the substrate 11 or the product 80. The product 80 is assumed to be configured with a hard material by which a biological tremor is transmitted to the piezoelectric film 135.

Accordingly, when a voltage output from the piezoelectric sensor 35 vibrates minutely at a frequency of around 5 to 20 Hz, the controller 16 determines that the piezoelectric sensor 35 detects a contact state in which a customer (typically the customer's hand or finger) is in contact with the substrate 11 or the product 80.

A biological tremor is a phenomenon unique to a living body. If the piezoelectric sensor 35 outputs a voltage when an object other than a living body is in contact with the substrate 11 or the product 80, and no frequency component is detected within a predetermined frequency band, the controller 16 determines that the piezoelectric sensor 35 does not detect a contact state.

Next, a description will be made of an example of a change in the output signal (pressing signal) of the piezoelectric sensor 35 while a customer holds the product 80.

Figure 7:
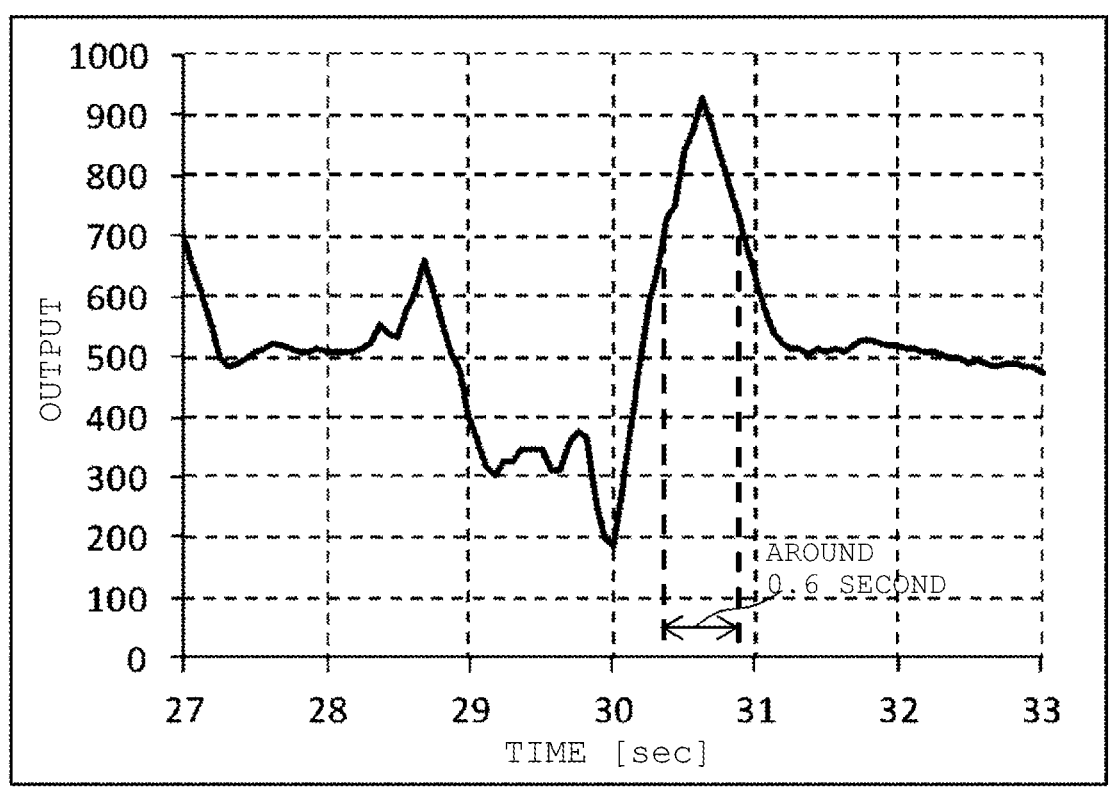
FIG. 7 is a graph showing a change in an output signal of a piezoelectric sensor 35 when a product 80 is turned over by a customer holding the product 80.
Figure 8:
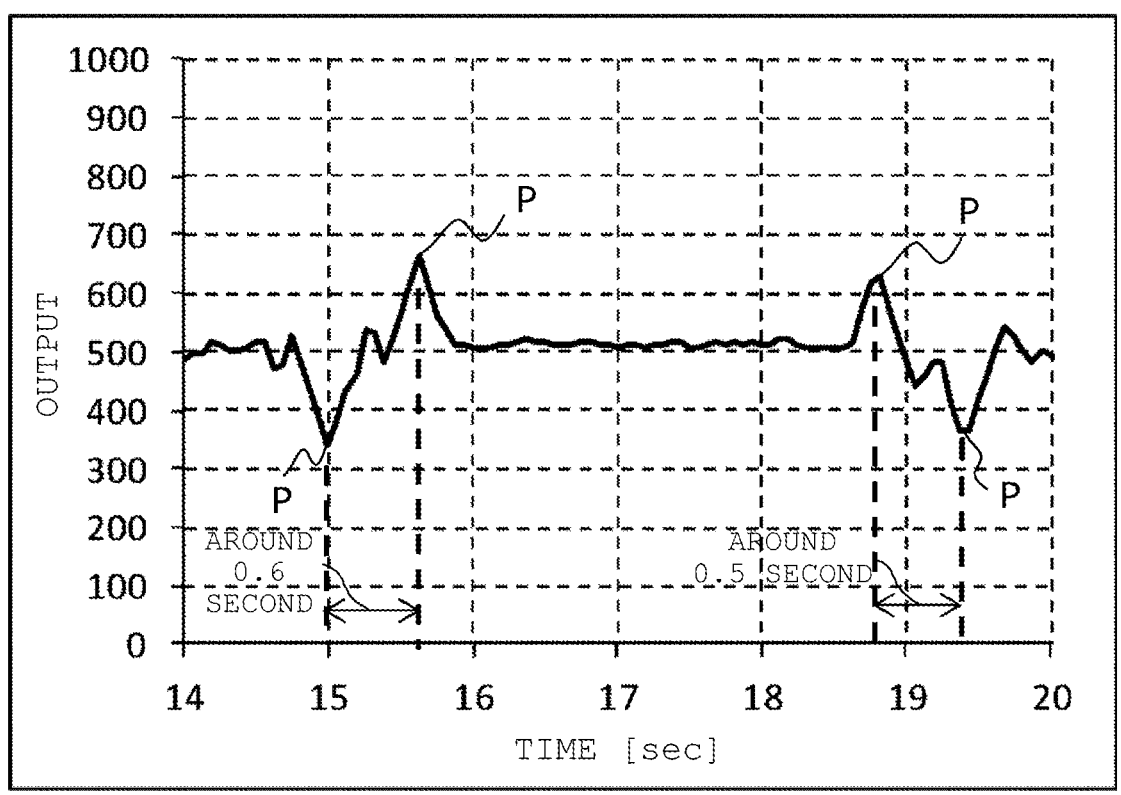
FIG. 8 is a graph showing a change in an output signal of the piezoelectric sensor 35 when part of the product 80 is compressed by a customer holding the product 80.

FIG. 7 is a graph showing the change in an output signal of the piezoelectric sensor 35 when the product 80 is turned over by a customer. FIG. 8 is a graph showing a change in the output signal of the piezoelectric sensor 35 when part of the product 80 is compressed by the customer.

The output signals shown in FIGS. 7 and 8 are preferably obtained by applying a moving average to the actual output signal of the piezoelectric sensor 35 so that a noise component is erased and a tendency of a signal change is clearer.

In this example, the output level when no displacement is generated in the product 80 (i.e., when the product is not moved) is 500.

As shown in FIG. 7, when a customer turns over the product 80 (in this case during the time period starting around the 29 seconds time period in the graph to the time period ending around 31 seconds in the graph), the output signal is changed significantly for a long period of time (i.e., a little over two seconds). The controller can use this information to determine whether the customer has turned over the product 80. For example, when a standard of determining that a customer turns over the product 80 once is set to "an output of 700 is continuously exceeded for 0.5 second", the controller 16 can detect (determine) that the product 80 has been turned over.

As shown in FIG. 8, when a customer compresses the product 80 for during a time interval extending from about 15 seconds on the graph to 19 seconds on the graph, the output signal changes in a manner that can be detected and a determination can be made that the customer has compressed the product. For example, when a standard of determining that a customer compresses (squeezes) the product 80 once is set to "a peak P in which an amplitude is 100 or larger than the non-deformed value (500) and 200 or smaller than the non-deformed value (500) is observed twice in one second", the controller 16 can detect that the customer has compressed (e.g., squeezed) the product 80.

The controller 16 can also detect the biological tremor described above from the output signals shown in FIGS. 7 and 8.

Next, a description will be made of operations performed by the controller 16 in the monitoring system 100.

Figure 9:
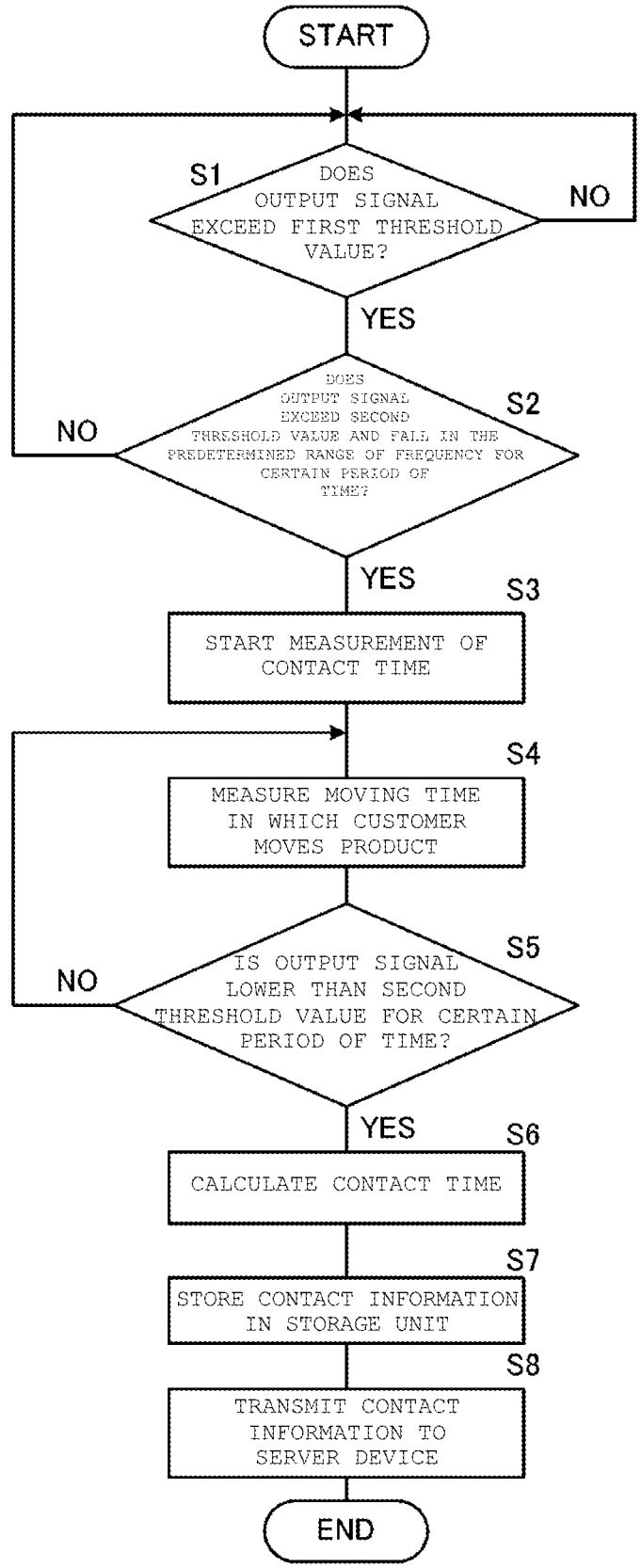
FIG. 9 is a flowchart showing operation performed by a controller 16 shown in FIG. 4.

FIG. 9 is a flowchart showing operations performed by the controller 16 shown in FIG. 4. The operation of FIG. 9 assumes a case where a customer shows an interest in the product 80 displayed on a display shelf in a selling area of a shop and the piezoelectric contact sensor unit 10 is attached to the product 80.

When the piezoelectric sensor 35 outputs a signal, the controller 16 determines whether or not the output signal exceeds the first threshold value (S1). The first threshold value is set, for example, based on a level of a signal generated when the product 80 is moved from a state in which the product 80 is static. In the present embodiment, the first threshold value is +Vth1 and −Vth1 as described above.

Next, the controller 16 determines whether or not an output signal of the piezoelectric sensor 35 both (a) exceeds a second threshold value for a certain period of time and (b) minutely vibrates at a frequency of around 5 to 20 Hz (S2). When an output signal of the piezoelectric sensor 35 does not exceed the second threshold value for a certain period of time or does not minutely vibrate at a frequency of around 5 to 20 Hz, the controller 16 returns to S1 and continues the processing.

The second threshold value is set, for example, based on a signal level of a minute vibration (biological tremor) generated when a living body is in contact with the substrate 11 or the product 80. The second threshold value is smaller than the first threshold value. In the present embodiment, the second threshold value is +Vth2 and −Vth2 as described above. The certain period of time is, for example, two seconds. In S2, the controller 16 can reliably discriminate (determine) whether an output signal of the piezoelectric sensor 35 indicates that a customer has accidentally contacted the product 80 or actually picks up the product 80.

Next, when an output signal from the piezoelectric sensor 35 exceeds the second threshold value for a certain period of time and minutely vibrates within a predetermined frequency band (for example, a band of around 5 to 20 Hz), the controller 16 determines that the piezoelectric sensor 35 detects a contact state in which a customer is in contact with the substrate 11 or the product 80. The controller 16 starts measurement of a contact time by using a timer circuit (not shown) (S3). Specifically, the controller 16 records a contact start time at which a minute vibration starts to be detected in the storage unit 17. The controller 16 then measures a moving time in which the product 80 is moved by the customer. During the moving time the minute vibration is detected (S4). For example, the controller 16 can determine that a customer holds and moves the product 80 when an output signal of the piezoelectric sensor 35 exceeds the third threshold value while the minute vibration is detected. When the moving time is large, a customer is considered to view the product 80 from various angles and check details of the product 80.

For this reason, the controller 16 can determine that a customer has an interest in the product 80. The third threshold value is set, for example, to a value between the second threshold value and the first threshold value. In the present embodiment, the third threshold value is +Vth3 and −Vth3 as described above.

Next, the controller 16 determines whether or not the customer has placed the product down. It does this by looking for an output signal of the piezoelectric sensor 35 which is lower than the second threshold value for a certain period of time (S5), for example two seconds. When a customer returns the product 80 to a product shelf, an output signal of the piezoelectric sensor 35 becomes lower than the second threshold value. For this reason, the controller 16 can reliably determine that a customer returns the product 80. When an output signal of the piezoelectric sensor 35 is determined not to be lower than the second threshold value for a certain period of time, the controller 16 returns to S4 and continues the processing.

Next, when an output signal of the piezoelectric sensor 35 is determined to be lower than the second threshold value for the certain period of time (i.e., the customer has placed the product down), the controller 16 calculates a contact time in which the customer held the product 80 based on the difference between the contact start time recorded in the storage unit 17 in S3 and the current time shown by the timer circuit (not shown) (S6).

The controller 16 stores the contact time and the moving time in the storage unit 17 as the contact information (S7). The contact time and the moving time show the degree of interest that the customer has in the product 80. For this reason, the controller 16 may calculate degree of interest a customer has in the product 80 based on the contact time and the moving time, and store the degree of interest in the storage unit 17 as the contact information.

Finally, the controller 16 transmits the contact time and the moving (movement) time as contact information to the host device 150 using the communication unit 40 (S8). The controller 116 of the host device 150 stores the contact information in the storage unit 117. The controller 116 of the host device 150 displays the contact information on the display 155. A salesperson can check the contact information on the display 155.

The controller 116 may calculate degree of interest a customer has in the product 80 based on the contact and the moving times and store the degree of interest in the storage unit 117 or display the degree of interest on the display 155 as the contact information.

As described above, the monitoring system 100 can reliably detect that a customer has picked up the product 80 and can determine the degree of interest that the customer has in the product 80. For this reason, a salesperson can grasp an inclination of a customer more in detail.

In the present embodiment, the controller 16 performs the processing of S1. However, the present invention is not limited to this configuration. When the present invention is implemented, the controller 16 may start from the processing of S2 without performing the processing of S1.

Hereinafter, a monitoring system according to a second embodiment of the present invention will be described.

Figure 10:
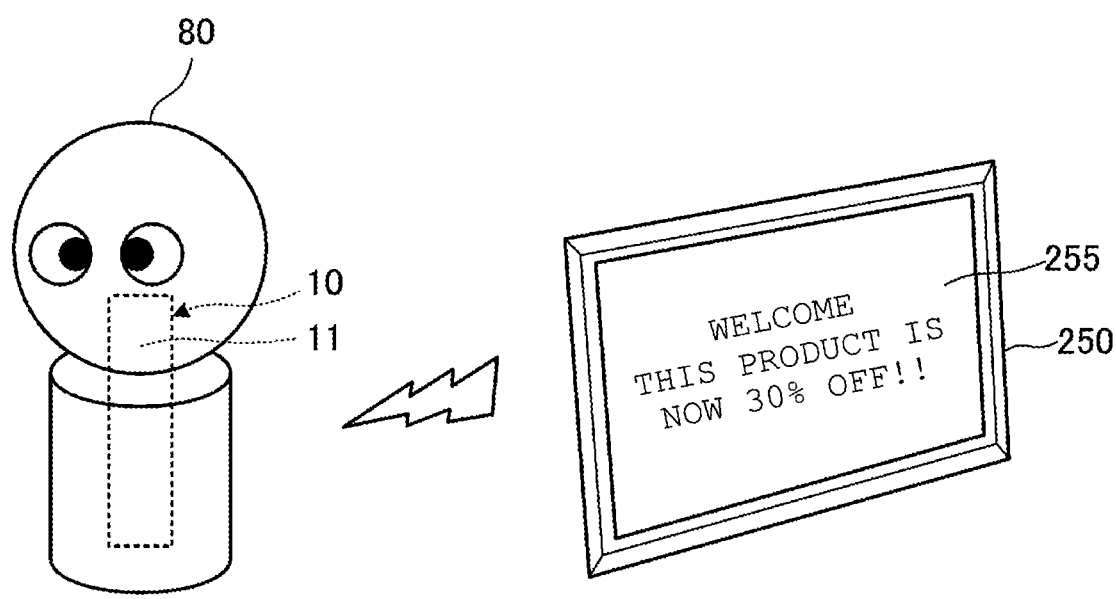
FIG. 10 is an external view of a monitoring system 200 according to a second embodiment of the present invention.
Figure 11:
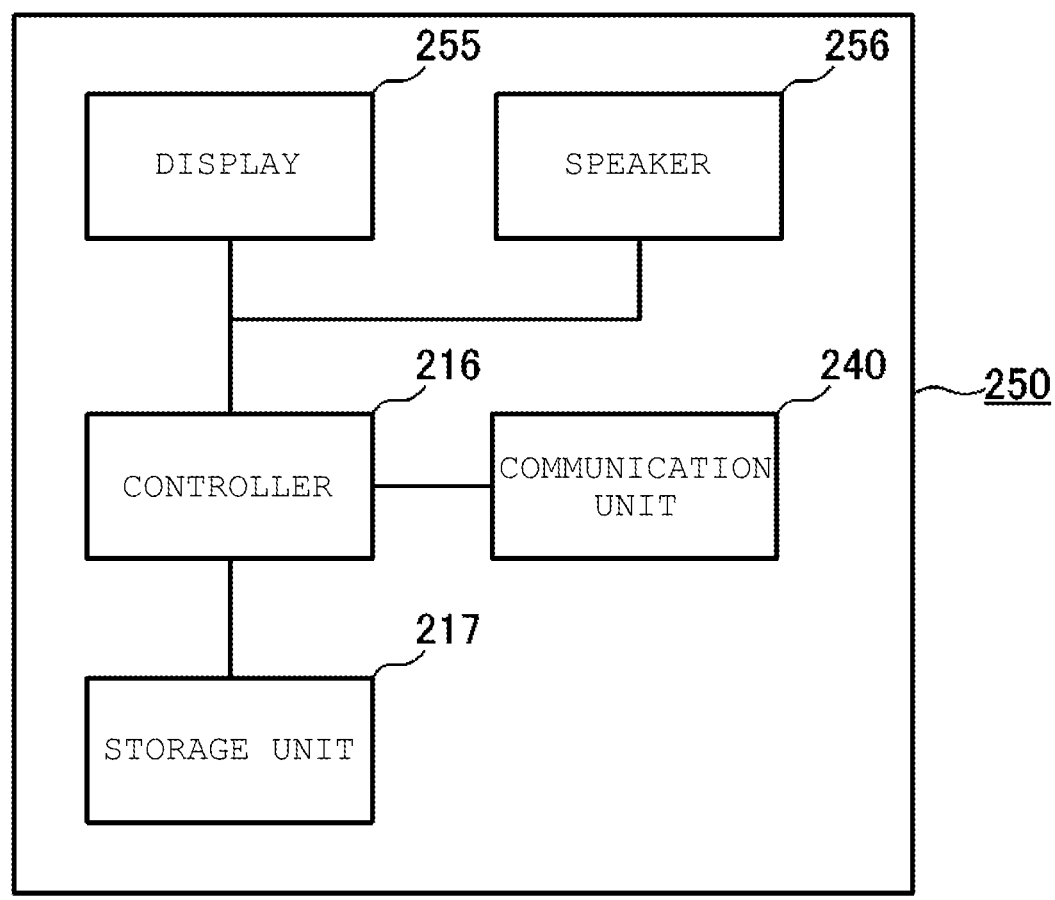
FIG. 11 is a block diagram of a display device 250 shown in FIG. 10.

FIG. 10 is an external view of a monitoring system 200 according to the second embodiment of the present invention. FIG. 11 is a block diagram of a display device 250 shown in FIG. 10. The monitoring system 200 is different from the monitoring system 100 with in that it includes a display device 250. The other configurations are the same, and will be omitted from the description.

The display device 250 (e.g., a tablet) includes a communication unit 240, a storage unit 217, a controller 216, a display 255, and a speaker 256 as shown in FIG. 11. The display device 250 is, for example, installed in a conspicuous location on a display shelf. The controller 216 is configured, for example, with a CPU. The storage unit 217 is configured, for example, with a flash memory. The display 255 is configured, for example, with a liquid crystal panel.

The display device 250 and a plurality of the piezoelectric contact sensor units 10 are connected, for example, by a wireless or wired LAN and transmits or receives predetermined information using the communication unit 240.

Next, a description will be made on operation performed by the controller 16 in the monitoring system 200.

Figure 12:
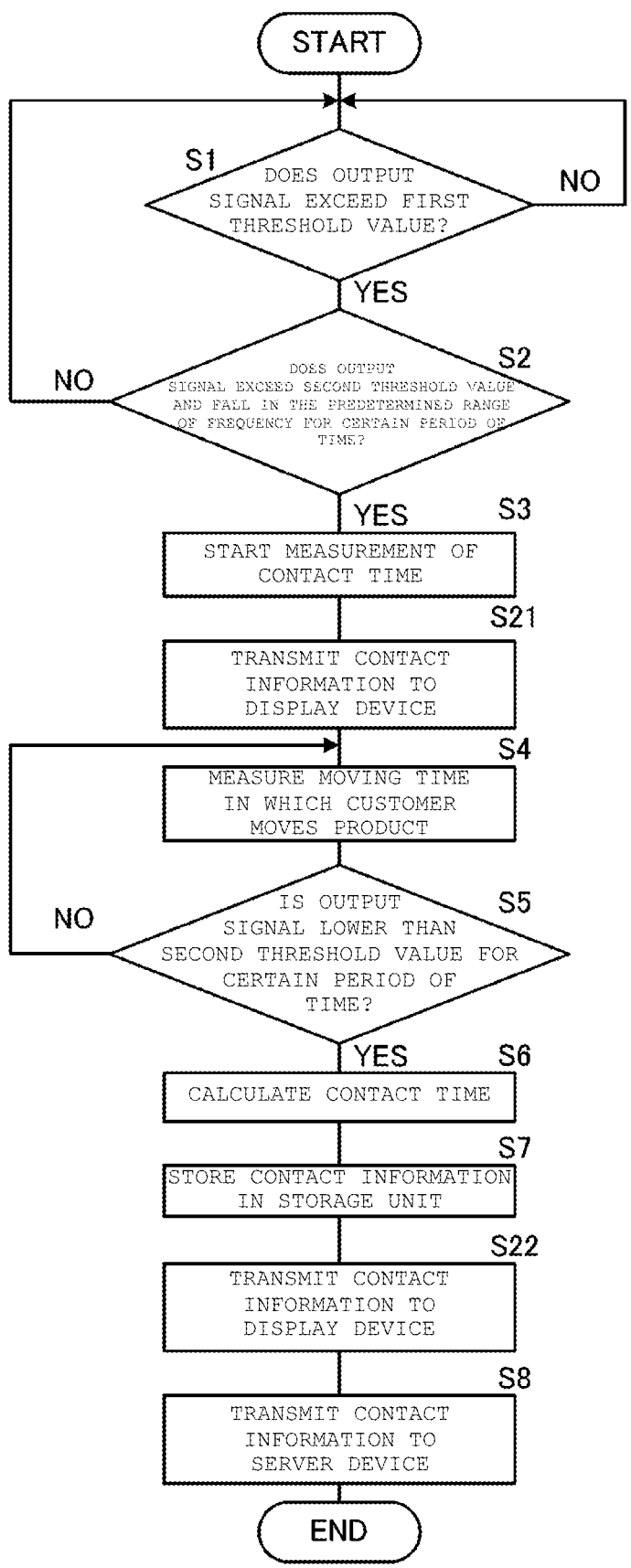
FIG. 12 is a flowchart showing operation performed by the controller 16 included in the piezoelectric contact sensor unit 10 shown in FIG. 10.

FIG. 12 is a flowchart showing operation performed by the controller 16 included in the piezoelectric contact sensor unit 10 shown in FIG. 10. The operation shown in FIG. 12 is operation shown in FIG. 9 to which S21 and S22 are added. The other processing is the same, and will be omitted from the description.

The controller 16 determines that the piezoelectric sensor 35 detects the contact state in which a customer is in contact with the substrate 11 or the product 80 in S2. After executing the processing of S3 described above, the controller 16 transmits the contact information showing the contact state to the display device 250 via the communication unit 40 (S21).

The display 255 of the display device 250 displays goods information relating to goods when the communication unit 240 receives the contact information. For example, the display 255 displays, as goods information, characters, such as "Welcome", and discount information. The controller 216 may reproduce a voice which is similar to a content displayed on the display 255 from the speaker 256. A customer views and listens to the goods information on the display 255 and from the speaker 256. In this manner, the monitoring system 200 can increase buying intention of a customer.

Next, after executing the processing of S7 described above, the controller 16 transmits the contact information to the display device 250 by using the communication unit 40 (S22). The contact information includes degree of interest that another customer has on the product 80.

The display 255 of the display device 250 displays goods information relating to goods when the communication unit 240 receives the contact information. For example, the display 255 displays, as goods information, characters, such as "Thank you", and degree of interest that another customer has in the product 80. The controller 216 may reproduce a voice which is similar to a content displayed on the display 255 from the speaker 256. A customer views and listens to the goods information on the display 255 and from the speaker 256. In this manner, the monitoring system 200 can increase buying intention of a customer.

As described above, the monitoring system 200 can attract a customer by using the display device 250 when a customer picks up the product 80, so as to promote buying of the product 80.

In the present embodiment, the controller 16 performs the processing of S1. However, the present invention is not limited to this configuration. When the present invention is implemented, the controller 16 may start from the processing of S2 without performing the processing of S1.

Hereinafter, a monitoring system according to a third embodiment of the present invention will be described.

Figure 13:
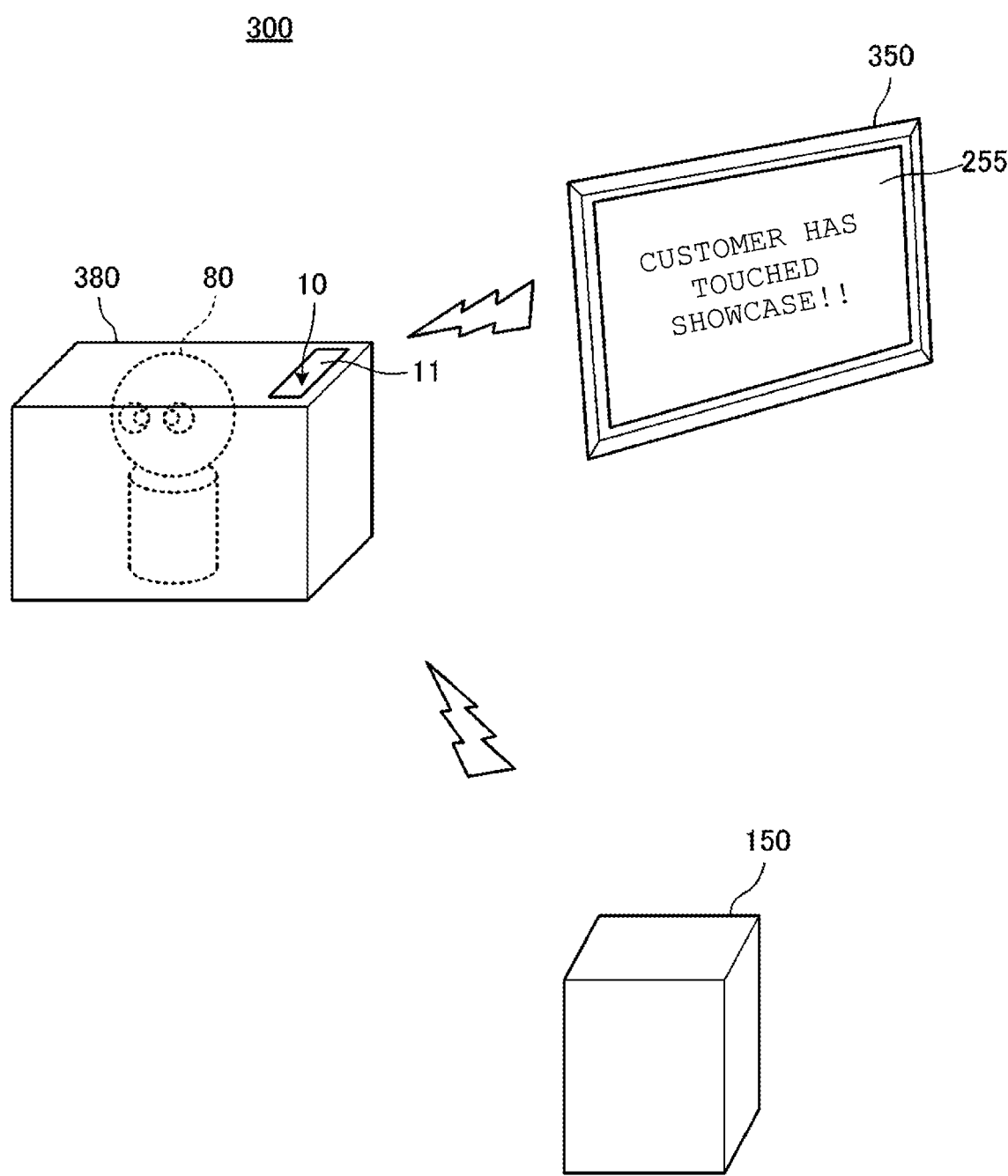
FIG. 13 is an external view of a monitoring system 300 according to a third embodiment of the present invention.

FIG. 13 is an external view of a monitoring system 300 according to the third embodiment of the present invention. The monitoring system 300 is different from the monitoring system 200 in that the monitoring system 300 includes a showcase 380 and a display device 350 (in lieu of the display device 250).

In the monitoring system 300, the product 80 is contained in the showcase 380. The piezoelectric contact sensor unit 10 is adhered to a back side (or other part of) the showcase 380. A material of the showcase 380 is, for example, glass. The other configurations are the same, and will be omitted from the description.

A PLLA film used for the piezoelectric film 135 of the piezoelectric sensor 35 of the piezoelectric contact sensor unit 10 is a material having a high transmittance. For this reason, in the monitoring system 300, the transparent piezoelectric contact sensor unit 10 can be implemented by configuring the signal electrode 136, the GND electrode 137, and the substrate 11 with a transparent material. The transparent piezoelectric contact sensor unit 10 does not lower visibility of the product 80.

A configuration of the display device 350 is the same as the configuration of the display device 250 shown in FIG. 11. The display device 350 is, for example, a tablet. However, the display device 350 is carried, for example, by a salesperson. The other points are the same, and will be omitted from the description.

The display device 350 and a plurality of the piezoelectric contact sensor units 10 are connected, for example, by a wireless LAN. The display device 350 transmits or receives predetermined information using the communication unit 240.

Next, a description will be made on operation performed by the controller 16 in the monitoring system 300.

Figure 14:
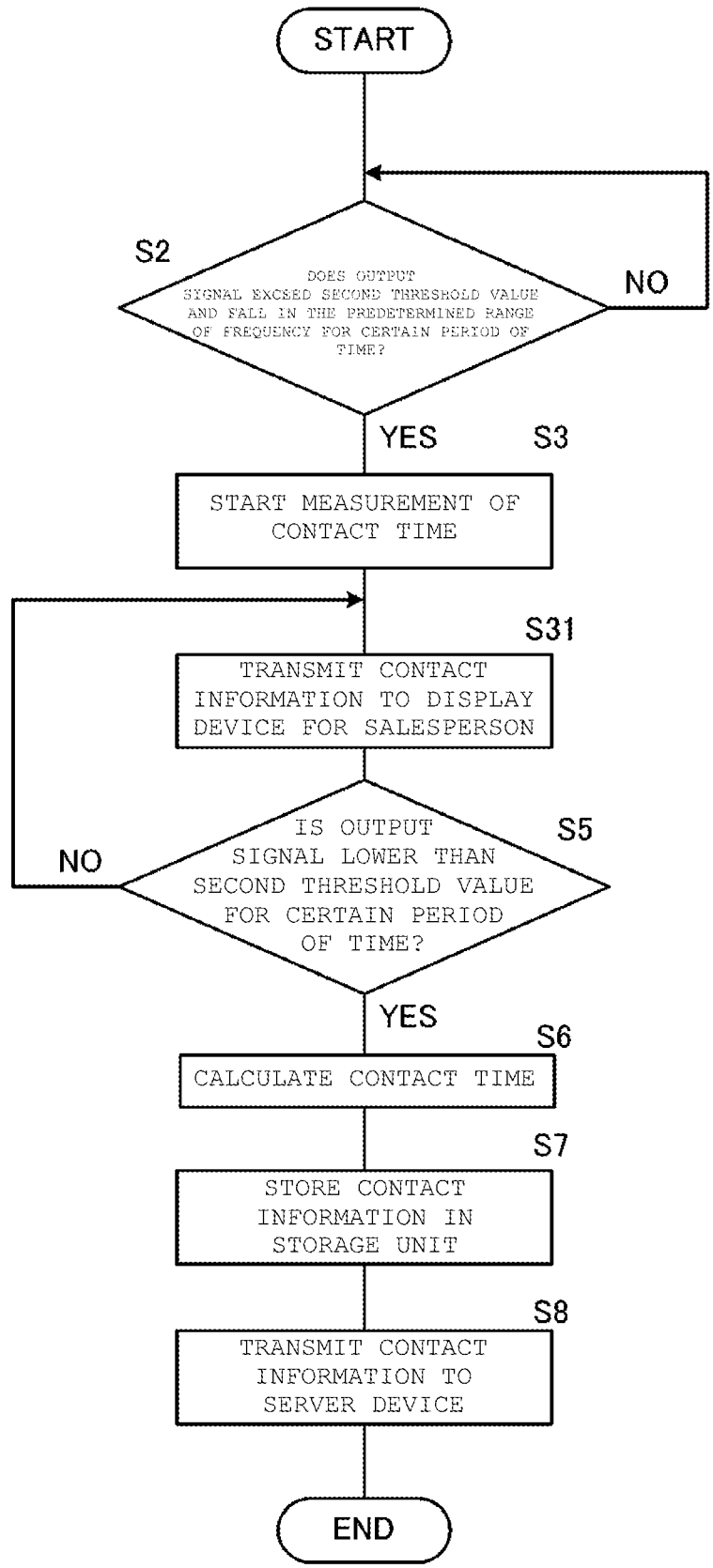
FIG. 14 is a flowchart showing operation performed by the controller 16 included in the piezoelectric contact sensor unit 10 shown in FIG. 13.

FIG. 14 is a flowchart showing operation performed by the controller 16 included in the piezoelectric contact sensor unit 10 shown in FIG. 13. The operation shown in FIG. 14 is substantially the same operation as that shown in FIG. 9, but steps S1 and S4 are deleted and S31 is added.

When the piezoelectric sensor 35 on the piezoelectric contact sensor unit 10 outputs a signal, the controller 16 determines whether or not (a) the output signal exceeds the second threshold value for a certain period of time, and (b) the output signal minutely vibrates at a frequency of around 5 to 20 Hz (S2).

In S2, the controller 16 determines a signal of a minute vibration (biological tremor) generated when a living body is in contact with the showcase 380. The second threshold value is set based on a signal level of a minute vibration (biological tremor) generated on the showcase 380 when a customer touches the showcase 380.

When the controller determines that an output signal from the piezoelectric sensor 35 exceeds the second threshold value for a certain period of time and minutely vibrates within a predetermined frequency band (for example, a band of around 5 to 20 Hz), it determines that the piezoelectric sensor 35 detects a contact state in which a customer is in contact with the showcase 380.

The controller 16 starts measurement of a contact time by using a timer circuit (not shown) (S3). Specifically, the controller 16 records a contact start time at which a minute vibration starts to be detected in the storage unit 17.

Next, the controller 16 transmits the contact information showing the contact state to the display device 350 by using the communication unit 40 (S31).

The display 255 or the speaker 256 of the display device 350 notifies the contact state when the communication unit 240 receives the contact information. For example, the display 255 displays characters, such as "Customer touches a showcase". The controller 216 may reproduce a voice which is similar to a content displayed on the display 255 from the speaker 256.

Based on the notification, a salesperson can promptly serve a customer by, for example, preparing a key of the showcase 380. In this manner, even when not being able to monitor the showcase 380 constantly, a salesperson can reliably grasp that a customer is studying closely the product 80 in front of the showcase 380. For this reason, the monitoring system 300 can prevent a salesperson from missing a timing of serving a customer.

Next, the controller 16 determines whether or not an output signal of the piezoelectric sensor 35 is lower than the second threshold value for a certain period of time (S5). The certain period of time is, for example, two seconds. When a customer removes a hand from the showcase 380, an output signal of the piezoelectric sensor 35 is lower than the second threshold value. For this reason, the controller 16 determines that a customer has moved away from the showcase 380. When determining an output signal of the piezoelectric sensor 35 not to be lower than the second threshold value for a certain period of time, the controller 16 returns to S31 and continues the processing.

Next, when determining an output signal of the piezoelectric sensor 35 to be lower than the second threshold value for a certain period of time, the controller 16 calculates a contact time in which a customer is in contact with the showcase 380 based on the contact start time recorded in the storage unit 17 in S3 and a current time shown by the timer circuit (not shown) (S6).

The controller 16 stores the contact time in the storage unit 17 as the contact information (S7). The contact time shows degree of interest that a customer has in the product 80. For this reason, the controller 16 may calculate degree of interest a customer has in the product 80 based on the contact time, and store the degree of interest in the storage unit 17 as the contact information.

Finally, the controller 16 transmits the contact time and the moving time as the contact information to the host device 150 by using the communication unit 40 (S8). The controller 116 of the host device 150 stores the contact information in the storage unit 117. The controller 116 of the host device 150 displays the contact information on the display 155. A salesperson checks the contact information on the display 155.

The controller 116 may calculate degree of interest a customer has in the product 80 based on the contact time, and store the degree of interest in the storage unit 117 or display the degree of interest on the display 155 as the contact information.

As described above, a salesperson can reliably grasp that a customer shows an interest in the product 80 in the showcase 380. For this reason, the monitoring system 300 can prevent a salesperson from missing a timing of serving a customer.

In the monitoring system 300, a customer does not need to deform the substrate 11 of the piezoelectric contact sensor unit 10. For this reason, the substrate 11 does not always need to have flexibility. Accordingly, the monitoring system 300 has an advantage that no damage is caused by bending deformation and the like which are performed repeatedly.

Hereinafter, a monitoring system according to a fourth embodiment of the present invention will be described.

Figure 15:
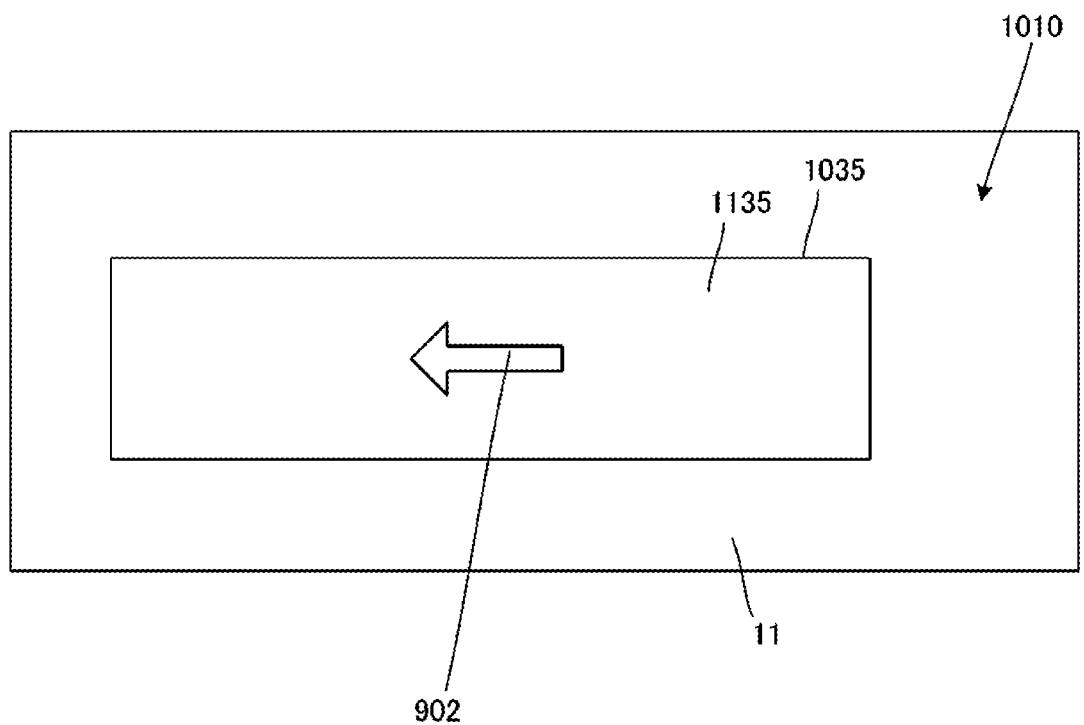
FIG. 15 is a front view of a piezoelectric contact sensor unit 1010 included in a monitoring system 400 according to a fourth embodiment of the present invention.

FIG. 15 is a front view of a piezoelectric contact sensor unit 1010 included in the monitoring system 400 according to the fourth embodiment of the present invention. The monitoring system 400 of the fourth embodiment is different from the monitoring system 100 of the first embodiment in that the piezoelectric contact sensor unit 1010 includes a sensor unit 1035 that detects twisting deformation of the substrate 11 in place of the piezoelectric sensor 35 that detects bending deformation of the substrate 11. A difference between the sensor unit 1035 and the piezoelectric sensor 35 is a piezoelectric film 1135. The other points of the monitoring system 400 are the same as those in the monitoring system 100, and will be omitted from the description.

A uniaxially stretching direction 902 of the piezoelectric film 1135 is different from the uniaxially stretching direction 901 of the piezoelectric film 135. The uniaxially stretching direction 902 of the piezoelectric film 1135 preferably forms an angle of 45° with respect to a diagonal line of the substrate 11. The uniaxially stretching direction 902 may preferably form an angle of 0° with respect to a longitudinal direction or a lateral direction of the substrate 11. However, the angle is not limited to the above, and may be designed as an appropriate angle in consideration of a characteristic and a use state of the piezoelectric film 1135.

The angle of 0° with respect to a longitudinal direction or a lateral direction of the substrate 11 is not limited to exactly 0°, and may be substantially 0°. The angle of substantially 0° includes, for example, an angle of around 0°±10°. The above angles are setting matters to be designed as appropriate in accordance with entire design, such as detection accuracy for twisting, based on a use of the piezoelectric contact sensor unit 1010.

When a customer applies an external force that twists the substrate 11 of the piezoelectric contact sensor unit 1010, the substrate 11 is twisted around the uniaxially stretching direction 902. In this case, the piezoelectric film 1135 of the sensor unit 1035 is stretched or shrunk.

For this reason, the sensor unit 1035 detects a charge generated on the signal electrode 136 and the GND electrode 137 of the piezoelectric film 1135. In this manner, the sensor unit 1035 detects bending deformation of the substrate 11. That is, the sensor unit 1035 detects a contact state in which a customer is in contact with the substrate 11.

That is, in the piezoelectric contact sensor unit 1010 of the monitoring system 400, the sensor unit 1035 detects both the biological tremor and twisting deformation. The sensor unit 1035 outputs a signal based on this detection to the controller 16. When the sensor unit 1035 on the piezoelectric contact sensor unit 1010 outputs a signal, the controller 16 determines the output signal.

Operation of the controller 16 in the monitoring system 400 is the same as the operation (refer to FIG. 9) of the controller 16 in the monitoring system 100, and will be omitted from the description.

The piezoelectric contact sensor unit 1010 may be used in place of the piezoelectric contact sensor unit 10 in the monitoring system 200 or the monitoring system 300.

Hereinafter, a monitoring system according to a fifth embodiment of the present invention will be described.

Figure 16:
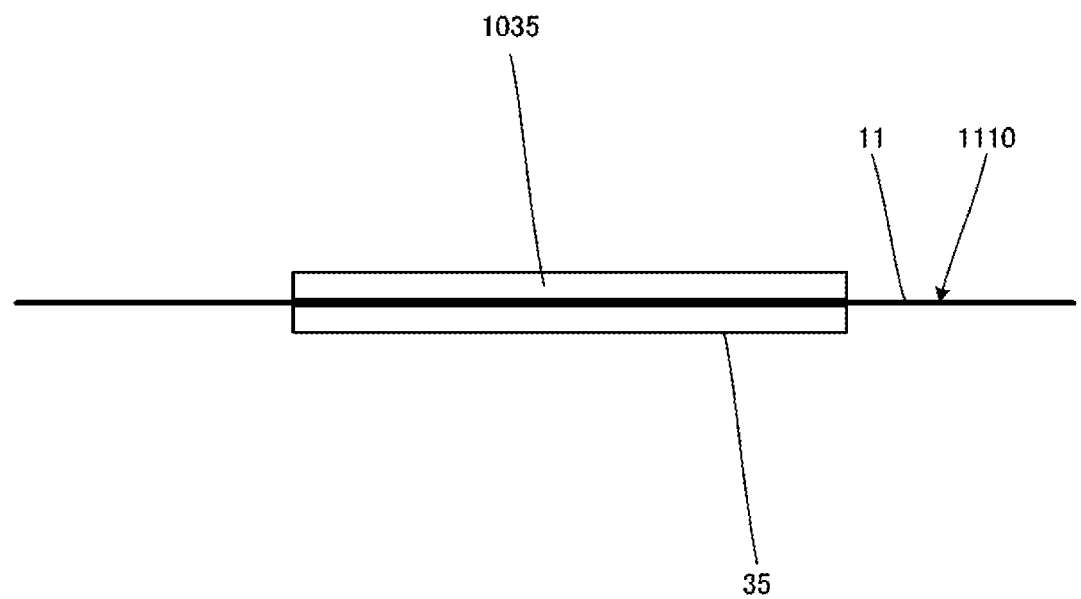
FIG. 16 is a side view of a piezoelectric contact sensor unit 1110 included in a monitoring system 500 according to a fifth embodiment of the present invention.

FIG. 16 is a side view of a piezoelectric contact sensor unit 1110 included in a monitoring system 500 according to the fifth embodiment of the present invention. The monitoring system 500 of the fifth embodiment is different from the monitoring system 100 of the first embodiment in that the piezoelectric contact sensor unit 1110 includes both the piezoelectric sensor 35 that detects bending deformation of the substrate 11 and the sensor unit 1035 that detects twisting deformation of the substrate 11. The other points of the monitoring system 500 are the same as those in the monitoring system 100, and will be omitted from the description.

In the piezoelectric contact sensor unit 1110 of the monitoring system 500, the piezoelectric sensor 35 and the sensor unit 1035 detect three characteristics, i.e., the biological tremor described above, bending deformation, and twisting deformation. The piezoelectric sensor 35 and the sensor unit 1035 output a signal based on the detection to the controller 16. When the piezoelectric sensor 35 and the sensor unit 1035 on the piezoelectric contact sensor unit 1110 output a signal, the controller 16 determines the output signal.

Operation of the controller 16 in the monitoring system 500 is the same as the operation (refer to FIG. 9) of the controller 16 in the monitoring system 100, and will be omitted from the description.

The piezoelectric contact sensor unit 1110 may be used in place of the piezoelectric contact sensor unit 10 in the monitoring system 200 or the monitoring system 300.

In the above embodiments, the description has been made on the case where the goods are a product 80 or the showcase 380. However, the present invention is not limited to the above. When the present invention is implemented, for example, the goods may be other than a product (for example, an exhibit and the like).

Similarly, in the above embodiments, the description has been made on the case where the living body is a customer. However, the present invention is not limited to the above. When the present invention is implemented, for example, the living body may be a person other than a customer (for example, a thief and the like). The configuration may be such that, for example, when a force larger than assumed is detected to be applied to the substrate 11, a thief is determined to destroy a showcase (an upper limit is set to a signal detected by the piezoelectric sensor 35 or the sensor unit 1035, and a trouble is determined to be generated when a force that exceeds the upper limit is detected).

In the above embodiments, the description has been made on the example where the substrate 11 is formed of a hard material like, for example, a glass epoxy board. However, the present invention is not limited to this configuration. When the present invention is implemented, for example, the substrate 11 may be formed of a soft material like a resin film.

In the above embodiments, the piezoelectric element is configured with a piezoelectric film. However, the present invention is not limited to this configuration. When the present invention is implemented, for example, the piezoelectric element may be configured with piezoelectric ceramic and the like.

Hereinafter, a monitoring system according to a sixth embodiment of the present invention will be described.

Figure 17:
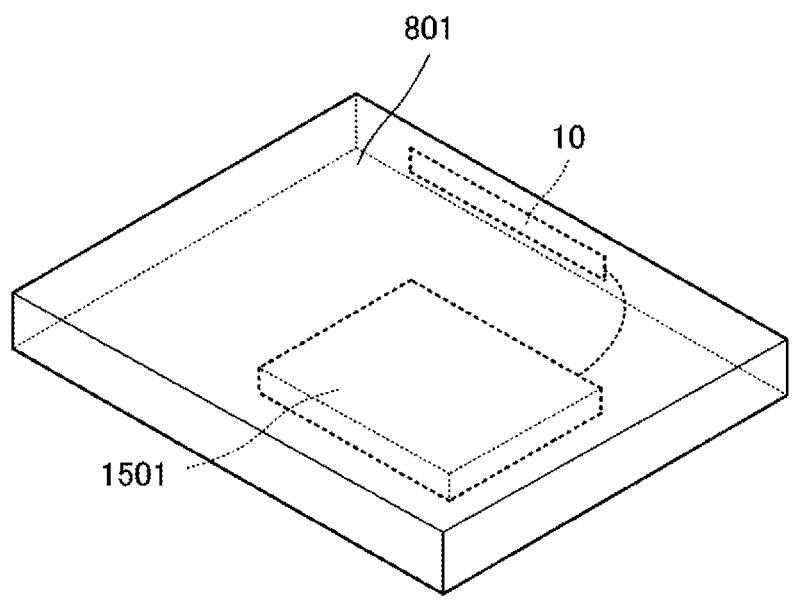
FIG. 17 is an external view of a monitoring system 600 according to a sixth embodiment of the present invention.

FIG. 17 is an external view of a monitoring system 600 according to the sixth embodiment of the present invention. The monitoring system 600 of the sixth embodiment is different from the monitoring system 100 of the first embodiment in that the piezoelectric contact sensor unit 10 and a host device 1501 are incorporated in a single housing 801 of, for example, a smartphone, and the piezoelectric contact sensor unit 10 and the host device 1501 are connected by wire. The function of the host device 1501 can be substituted by, for example, a CPU incorporated in a smartphone. The piezoelectric contact sensor unit 10 is adhered, for example, to an inner surface of the housing 801 of a smartphone. The sixth embodiment shows an embodiment as a smartphone. However, an application is not limited to a smartphone, and the present invention can also be applied to, for example, mobile terminals, such as a mouse, a clock, and a camera, a vacuum cleaner, a dryer, an electric bicycle, or equipment held by hand and operated, such as household electric appliances like an electric toothbrush.

An operation process of the present embodiment will be described hereinafter.

First, when pressing force is detected by the piezoelectric contact sensor unit 10, processing associated with the piezoelectric contact sensor unit 10 is executed. The processing includes, for example, a wake-up function for a screen operation standby state, a volume adjustment standby state, and the like.

Next, execution of the processing associated with the piezoelectric contact sensor unit 10 triggers detection of a minute vibration (biological tremor). While the piezoelectric contact sensor unit 10 detects a minute vibration (biological tremor), a function associated with the piezoelectric contact sensor unit 10 is not finished even when a pressing operation detection is not applied for a certain period of time. The detection of a minute vibration (biological tremor) performed by the piezoelectric contact sensor unit 10 does not need to be always performed constantly, and may be performed at intervals of, for example, one to three seconds. At a time point at which no minute vibration (biological tremor) is detected by the piezoelectric contact sensor unit 10, the function associated with the piezoelectric contact sensor unit 10 is finished.

For example, the configuration may be such that the function associated with the piezoelectric contact sensor unit 10 is finished when neither the minute vibration (biological tremor) nor the pressing operation have been detected for several seconds. It is advantageous to determine whether a person is holding the product by detecting a minute vibration (biological tremor) using the piezoelectric effect of the piezoelectric contact sensor unit 10. However, there is a problem that the detection is easily influenced by noise caused by a vibration and the like of the surroundings. In order to mitigate this problem, the high sensitivity of the piezoelectric contact sensor unit 10 can be reduced during periods before the application of pressure to the piezoelectric contact sensor unit is detected using a CPU incorporated in a smartphone. To that end, the CPU sets a low-sensitivity mode until the application of pressure is detected and then switches the mode to a high-sensitivity mode once the application of pressure is detected. After switching is made from the low-sensitivity mode to the high-sensitivity mode, the high-sensitivity mode may be continuously set.

In another example, the CPU incorporated in the smartphone can prevent the erroneous operation by switching between the high-sensitivity mode and the low-sensitivity mode at predetermined periods of time. In this case, a distinction between whether a minute vibration (biological tremor) is detected by the piezoelectric contact sensor unit 10 or the detection is influenced by noise caused by a vibration of the surroundings and the like can be detected early as compared to when the modes are not switched at predetermined periods of time.

Hereinafter, a monitoring system according to a seventh embodiment of the present invention will be described.

Figure 18:
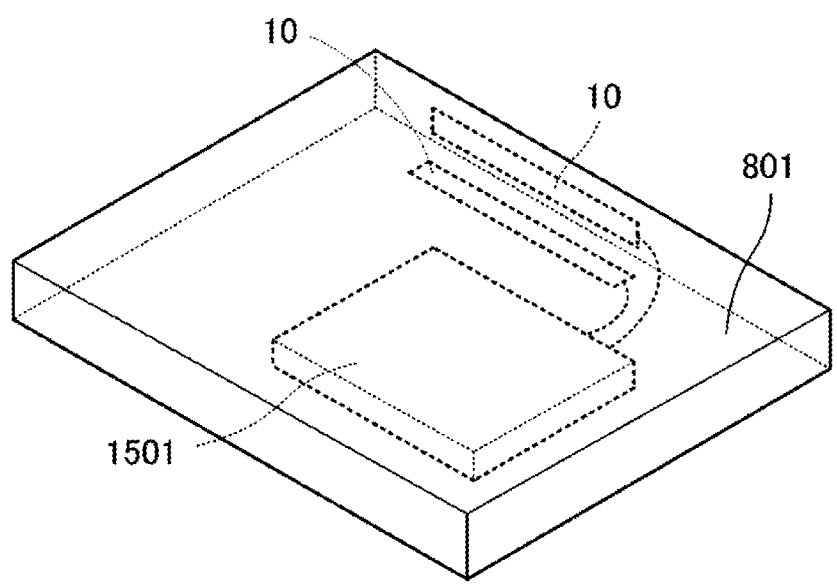
FIG. 18 is an external view of a monitoring system 700 according to a seventh embodiment of the present invention.

FIG. 18 is an external view of a monitoring system 700 according to the seventh embodiment of the present invention. The monitoring system 700 of the seventh embodiment is different from the monitoring system 600 of the sixth embodiment in that a pair of piezoelectric contact sensor units 10, 10 are adhered to respective, different, inner surfaces of the housing 801 of a smartphone.

In the sixth embodiment, when unintended deformation, such as deformation of a bottom surface of the housing 801, is made, the unintended deformation may be transmitted to the piezoelectric contact sensor unit 10 adhered to a side surface of the housing 801 and erroneous operation may be performed.

In view of the above, in the seventh embodiment, the piezoelectric contact sensor units 10, 10 are disposed on various surfaces of the housing 801 of a smartphone and a difference between detection signals of the piezoelectric contact sensor units 10, 10 is observed. In this manner, an operator can determine which surface of the housing 801 of a smartphone is being deformed.

Surfaces on which the piezoelectric contact sensor units 10, 10 are disposed are not limited to those in the example of FIG. 18. For example, the configuration may be such that the piezoelectric contact sensor units 10, 10 are adhered to a substrate surface incorporated in a smartphone and a main surface and a housing side surface of a display, and a difference in detection signals of the piezoelectric contact sensor units 10, 10 is observed.

Hereinafter, a monitoring system according to an eighth embodiment of the present invention will be described.

Figure 19A:
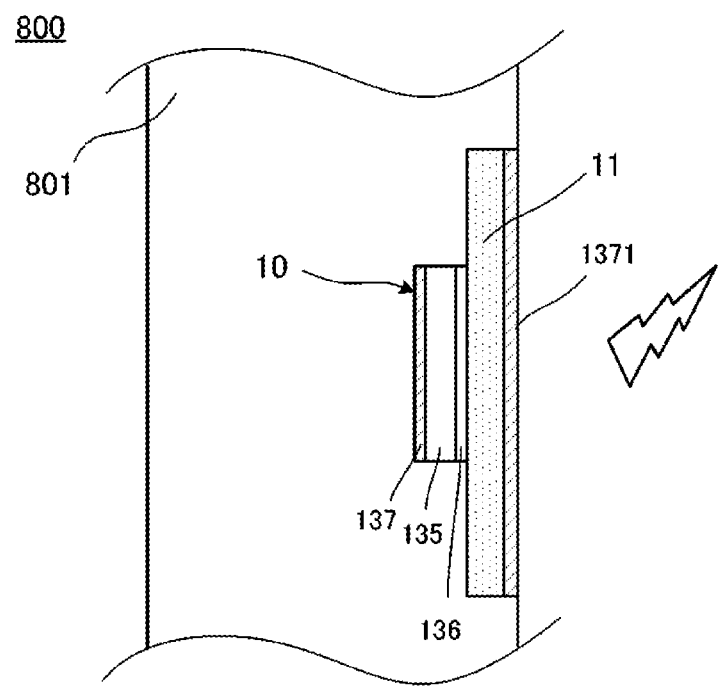
FIGS. 19A and 19B are cross-sectional views showing an attaching structure of the piezoelectric contact sensor unit 10 included in a monitoring system 800 according to an eighth embodiment of the present invention to a housing 801.

FIG. 19A is a cross-sectional view showing an attaching structure of the piezoelectric contact sensor unit 10 included in a monitoring system 800 according to the eighth embodiment of the present invention to the housing 801. In the present embodiment, the substrate 11 is adhered to an inner wall surface of the housing 801 of a smartphone by a double-sided tape, and the piezoelectric contact sensor unit 10 is attached to the substrate 11. Size of the substrate 11 is larger than the piezoelectric contact sensor unit 10. A GND electrode 1371 is formed on a surface of the substrate 11 to which the piezoelectric contact sensor unit 10 is not attached. A surface of the piezoelectric contact sensor unit 10 on which the GND electrode 137 is not formed (a surface on which the signal electrode 136 is formed) and a surface of the substrate 11 on which the GND electrode 1371 is not formed, are bonded. In a planar view, the GND electrode 1371 of the substrate 11 overlaps the piezoelectric contact sensor unit 10 and is larger than the piezoelectric contact sensor unit 10. By the above configuration, noise from the outside of the housing can be prevented (or at least mitigated) from reaching the piezoelectric contact sensor unit 10. That is, when a surface of the substrate 11 to which the piezoelectric contact sensor unit 10 is not attached is adhered at a position closer to an inner wall surface of the housing 801 of the smartphone than the piezoelectric contact sensor unit 10, the risk that noise from the outside of the housing reaches the piezoelectric contact sensor unit 10 can be reduced.

Figure 19B:
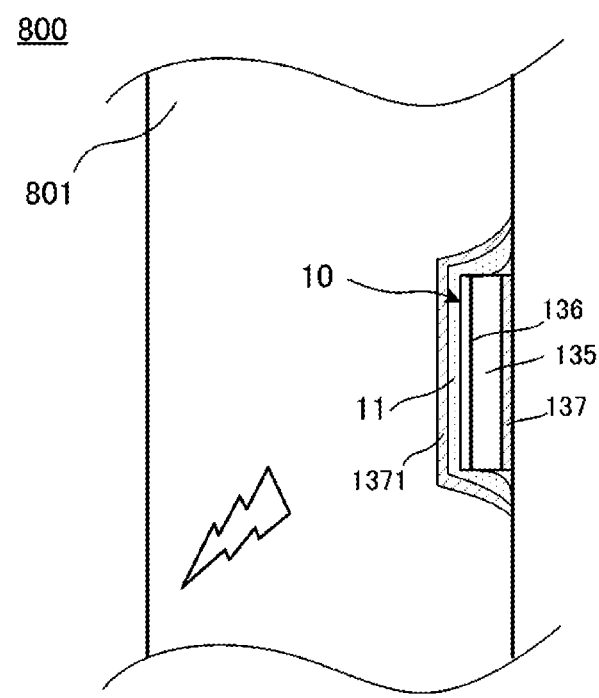

FIG. 19B is a cross-sectional view showing an attaching structure of the piezoelectric contact sensor unit 10 included in a monitoring system 800 according to the eighth embodiment of the present invention to the housing 801. In the present embodiment, the piezoelectric contact sensor unit 10 is adhered to an inner wall surface of the housing 801 of a smartphone by a double-sided tape and the substrate 11 is attached in a manner of covering the piezoelectric contact sensor unit 10. Size of the substrate 11 is larger than the piezoelectric contact sensor unit 10. A GND electrode 1371 is formed on a surface of the substrate 11 to which the piezoelectric contact sensor unit 10 is not attached. A surface of the piezoelectric contact sensor unit 10 on which the GND electrode 137 is not formed (a surface on which the signal electrode 136 is formed) and a surface of the substrate 11 on which the GND electrode 1371 is not formed are bonded. In a planar view, the GND electrode 1371 of the substrate 11 overlaps the piezoelectric contact sensor unit 10 and is larger than the piezoelectric contact sensor unit 10. As a result of the above configuration, noise from the inside of the housing can be prevented (or at least ameliorated) from reaching the piezoelectric contact sensor unit 10. That is, when a surface of the substrate 11 to which the piezoelectric contact sensor unit 10 is not attached is adhered at a position closer to a center section of the housing 801 of the smartphone than the piezoelectric contact sensor unit 10, the influence of noise from the inside of the housing can be restricted.

The description of the above embodiments are exemplifications in every aspect, and should be considered as not restrictive. The scope of the present invention is shown by the scope of claims, and not by the above embodiments. Further, the scope of the present invention includes a scope equal to the scope of the claims.

DESCRIPTION OF REFERENCE SYMBOLS

- 10: Piezoelectric contact sensor unit
- 11: Substrate
- 16: Controller
- 17: Storage unit
- 35: Piezoelectric sensor
- 40: Communication unit
- 80: Product
- 100: Monitoring system
- 116: Controller
- 117: Storage unit
- 135: Piezoelectric film
- 136: Signal electrode
- 137: GND electrode
- 140: Communication unit
- 150: Server device
- 155: Display
- 200: Monitoring system
- 216: Controller
- 217: Storage unit
- 240: Communication unit
- 250: Display device
- 255: Display
- 256: Speaker
- 300: Monitoring system
- 350: Display device
- 380: Showcase
- 400: Monitoring system
- 500: Monitoring system
- 901: Uniaxially stretching direction
- 902: Uniaxially stretching direction
- 1010: Piezoelectric contact sensor unit
- 1035: Sensor unit
- 1110: Piezoelectric contact sensor unit
- 1135: Piezoelectric film

The invention claimed is:

1. A monitoring system for determining whether an object is contacted by a living body, the monitoring system comprising:
   a receiver;
   a piezoelectric sensor attached to a substrate such that when the substrate is attached to the object, the piezoelectric sensor generates an output signal as a function of whether the living body is in contact with at least one of the substrate and the object;
   a processor that processes the output signal to determine an amount of time that the living body is in continuous contact with at least one of the substrate and the object as a function of whether a frequency of the output signal falls within a predetermined range corresponding to a biological tremor, the processor outputting a contact information signal containing information indicating the amount of time the living body is in contact with at least one of the substrate and object as a function of the determination; and
   a transmitter that transmits the contact information signal to the receiver.

2. The monitoring system according to claim 1, wherein the piezoelectric sensor also detects bending forces applied to the substrate and the output signal contains information indicative of such detected bending forces.

3. The monitoring system according to claim 2, wherein the processor determines the amount of time that the living body is in contact with at least one of the substrate and the object as a function of whether or not the frequency of the output signal falls with the predetermined range and whether or not the output signal indicates that a predetermined level of bending forces have been applied to the substrate.

4. The monitoring system according to claim 1, wherein the processor only outputs the contact information signal when it has determined that the object has been picked up.

5. The monitoring system according to claim 1, wherein the processor only outputs the contact information signal when it has determined that the living body has been in contact with the substrate and/or the object for a predetermined period of time.

6. The monitoring system according to claim 1, wherein the object is a product.

7. The monitoring system according to claim 1, wherein the object is a display case.

8. The monitoring system according to claim 1, wherein the receiver includes a display which displays information indicating that the living body has been in contact with at least one of the substrate and the object.

9. The monitoring system according to claim 1, wherein the receiver includes a display which displays information concerning the object.

10. The monitoring system according to claim 9, wherein the information is sales information relating to the object.

11. The monitoring system according to claim 1, wherein the receiver includes a notification unit that provides an indication that the living body has been in contact with the object for at least two seconds.

12. The monitoring system according to claim 11, wherein the indication is visual.

13. The notification system according to claim 12, wherein the indication is also audible.

14. The notification system according to claim 1, wherein the processor determines that the object has been picked up by the living body when the frequency of the output signal falls within the predetermined range and the length of time between two spikes in the magnitude of the output signal exceeds a first threshold, the first spike having an absolute value which is greater than a second threshold, the second spike having an absolute value which is greater than a third threshold.

15. The notification system according to claim 14, wherein the living body is a human and the receiver displays information indicating that the human has an interest in purchasing the object.

16. The notification system according to claim 1, wherein the piezoelectric sensor is not an acceleration sensor.

17. The notification system according to claim 1, wherein the living body is a human and the receiver provides in indication that the human has an interest in purchasing the object as a function of the amount of time that the living body has been in contact with at least one of the substrate and the object.

* * * * *